(12) United States Patent
Blosse

(10) Patent No.: US 7,323,411 B1
(45) Date of Patent: Jan. 29, 2008

(54) METHOD OF SELECTIVE TUNGSTEN DEPOSITION ON A SILICON SURFACE

(75) Inventor: Alain Blosse, Belmont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 126 days.

(21) Appl. No.: 10/947,563

(22) Filed: Sep. 22, 2004

Related U.S. Application Data

(60) Provisional application No. 60/506,192, filed on Sep. 26, 2003.

(51) Int. Cl.
*H01L 21/44* (2006.01)

(52) U.S. Cl. .............. 438/674; 257/E21.17; 438/677; 438/680; 427/96.8; 427/124

(58) Field of Classification Search .............. 438/674, 438/677, 680, 685; 257/E21.17; 427/96.8, 427/124, 255.28
See application file for complete search history.

(56) References Cited

U.S. PATENT DOCUMENTS

| | | | | |
|---|---|---|---|---|
| 5,795,824 | A * | 8/1998 | Hancock | 438/656 |
| 6,063,680 | A * | 5/2000 | Wu | 438/303 |
| 6,100,173 | A * | 8/2000 | Gardner et al. | 438/592 |
| 6,174,795 | B1 * | 1/2001 | Shih et al. | 438/597 |
| 6,193,813 | B1 * | 2/2001 | Tseng et al. | 148/33.3 |
| 6,429,126 | B1 * | 8/2002 | Herner et al. | 438/680 |
| 2001/0019857 | A1 * | 9/2001 | Yokoyama et al. | 438/142 |
| 2003/0011035 | A1 * | 1/2003 | Komatsu | 257/407 |
| 2003/0207563 | A1 * | 11/2003 | Smith et al. | 438/637 |
| 2004/0107020 | A1 * | 6/2004 | Yokoyama et al. | 700/121 |

OTHER PUBLICATIONS

Yamamoto, Y. "A study on low-temperature selective growth of tungsten by CVD" Record of Electrical and Communication Engineering Conversazaione Tohoku University (Aug. 2000), vol. 69, No. 1, (Abstract).*

Yamamoto, Y., et al. "H-termination effects on initial growth characteristics of W on Si using WF6 and SiH4 gases" Journal de Physique IV (Proceedings) (Sep. 1999), vol. 9, No. 8, No. 8, (Abstract).*

Kow-Ming Chang et al., "A Simple and Efficient Pretreatment Technology for Selective Tungsten Deposition in Low-Pressure Chemical Vapor Deposition Reactor" Dec. 1994, pp. 7071-7075, vol. 33, Part 1, No. 12B, Japanese Journal of Applied Physics.

Kow-Ming Chang et al., "Influences of damage and contamination from reactive ion etching on selective tungsten deposition in a low-pressure chemical-vapor-deposition reactor" Sep. 1, 1996, pp. 3056-3061, vol. 80, No. 5, Journal of Applied Physics.

Kow-Ming Chang et al., "Interface Characteristics of Selective Tungsten on Silicon Using a New Pretreatment Technology for ULSI Application" May 1997, pp. 738-743, vol. 44, No. 5, IEEE Transactions on Elecron Devices.

* cited by examiner

*Primary Examiner*—Caridad Everhart
(74) *Attorney, Agent, or Firm*—Okamoto & Benedicto LLP

(57) ABSTRACT

In one embodiment, a selective tungsten deposition process includes the steps of pre-flowing silane into a deposition chamber, pumping down the chamber, and then selectively depositing tungsten on a silicon surface. The silane pre-flow helps minimize silicon consumption, while the pump down helps prevent loss of tungsten selectivity to silicon.

20 Claims, 2 Drawing Sheets

METHOD OF SELECTIVE TUNGSTEN DEPOSITION ON A SILICON SURFACE

REFERENCE TO RELATED APPLICATION

This application claims the benefit of U.S. Provisional Application No. 60/506,192, entitled "Method of Selective Tungsten Deposition on a Silicon Surface," filed by Alain Blosse on Sep. 26, 2003, which is incorporated herein by reference in its entirety.

BACKGROUND OF THE INVENTION

1. Field of the Invention

The present invention relates generally to integrated circuits, and more particularly but not exclusively to integrated circuit fabrication processes and structures.

2. Description of the Background Art

In the manufacture of integrated circuits, selective deposition refers to a process of depositing materials on selected surfaces of structures. Selective deposition does not require a mask, and thus obviates the need for associated lithography, etching, and resist removal steps. In selective chemical vapor deposition (CVD), selectivity is due to the different chemical behavior of reactants to different surfaces. For example, tungsten may be selectively deposited on a bare silicon substrate without the tungsten growing on a dielectric material. Due to nucleation matters, the tungsten starts to grow immediately on the silicon substrate while the nucleation on the dielectric material is retarded. Selective CVD processes are advantageous because they allow for self-alignment with respect to various structures, thus allowing for relatively tight design rules. Therefore, techniques for minimizing selectively loss in selective deposition processes are highly desirable.

SUMMARY

In one embodiment, a selective tungsten deposition process includes the steps of pre-flowing silane into a deposition chamber, pumping down the chamber, and then selectively depositing tungsten on a silicon surface. The silane pre-flow helps minimize silicon consumption, while the pump down helps prevent loss of tungsten selectivity to silicon.

These and other features of the present invention will be readily apparent to persons of ordinary skill in the art upon reading the entirety of this disclosure, which includes the accompanying drawings and claims.

Figure 1:
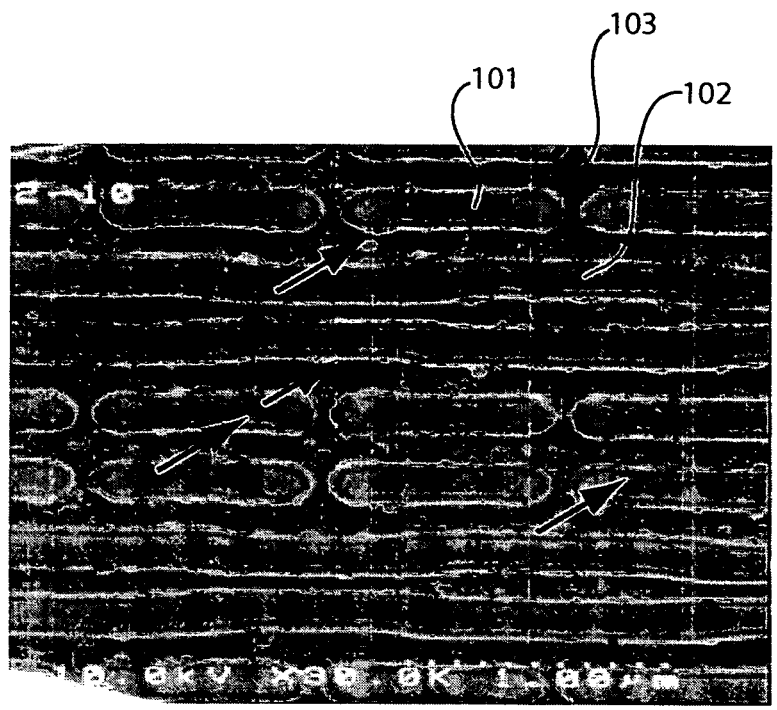
FIG. 1 shows a scanning electron micrograph of an example integrated circuit structure.

The use of the same reference label in different drawings indicates the same or like components.

DETAILED DESCRIPTION

In the present disclosure, numerous specific details are provided such as examples of apparatus, process parameters, materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Selective deposition of tungsten on a silicon surface, such as on a bare silicon substrate, may be achieved by reacting tungsten hexafluoride ($WF_6$) with the surface of the silicon according to the following reaction:

$$3Si + 2WF_6 \rightarrow 3SiF_4 + 2W \qquad \text{EQ. 1}$$

The above reaction consumes silicon but is self limiting. However, the silicon consumption may still be high enough to create problems in some applications. For example, a selective tungsten deposition process may result in leakage in an N+/P− junction in a silicon substrate.

To reduce silicon consumption, silane ($SiH_4$) may be added to the process according to the following reaction:

$$2WF_6 + 3SiH_4 \rightarrow 3SiF_4 + 2W + 6H_2 \qquad \text{EQ. 2}$$

(see, John E. Schmitz "Chemical Vapor Deposition of Tungsten and Tungsten Silicides for VLSI/ULSI Applications," 1992 Noyes publications ISBN 0-8155-1288-2) or $$WF_6 + 2SiH_4 \rightarrow 2SiHF_3 + 2W + 3H_2 \qquad \text{EQ. 3}$$

Reduction of $WF_6$ by silane is preferred to the reduction of $WF_6$ by hydrogen ($H_2$) because it eliminates the risk of tunnels formation (wormholes) and reduces Si consumption.

$WF_6$ reduction by hydrogen follows the reaction:

$$2WF_6 + 6H_2 \rightarrow 12HF + 2W \qquad \text{EQ. 4}$$

As a specific example, a selective tungsten CVD process may be performed by flowing silane into the deposition chamber along with tungsten hexafluoride. An example selective tungsten CVD process with silane is shown in Table 1. The example process of Table 1 may be employed in the fabrication of a MOS transistor. For example, the process of Table 1 may be performed after a source/drain implant in a silicon substrate and a rapid thermal annealing step.

TABLE 1

| | |
|---|---|
| SPM clean | $H_2SO_4 + H_2O_2$, 80° C., 300 sec |
| $H_2$ plasma | $H_2$ 500 sccm, P = 13 Pa, 200 W, 90 sec |
| HF clean | HF 1%, 15 sec |
| Selective W deposition | T = 250° C., Pre-flow $WF_6$, P = 0.3 Pa |
| | T = 250° C., P = 0.3 Pa, $WF_6$ = 10 sccm, SiH4 = 5 sccm in situ Post Anneal: 520° C. 60 sec |

Although flowing silane with tungsten helps minimize silicon consumption, tungsten selectivity to silicon is reduced. Several techniques have been developed to minimize selectively loss in this type of process including lowering of the deposition temperature, performing a Caro's acid (remove resist residues) and $H_2$ plasma clean (slight Si etch of the contaminated surface of the substrate) prior to a hydrofluoric acid (HF) wet pre-clean, and performing a hydrofluoric acid wet clean before deposition. However, selectivity loss remains a problem in selectively depositing tungsten on silicon surfaces.

Introducing silane into the deposition chamber before the tungsten hexafluoride or precursor may provide somewhat better results than flowing the silane and the tungsten hexafluoride at the same time. The pre-flowed silane reduces silicon consumption by passivating active nucleation sites (e.g., silicon crystalline defects; fluorine, compounds, or silicon-hydrogen links) at the surface of the silicon. However, the silane also reacts with defects at the surface of dielectric materials, such as silicon nitride ($Si_3N_4$) or silicon dioxide ($SiO_2$), resulting in the silane's silicon-hydrogen (Si—H) bond being broken and silicon-hydrogen$_x$ (Si—H$_x$) being chemisorbed. The resulting nuclei at the surface of the dielectric promote tungsten growth on the surface of the dielectric, thus losing selectivity to silicon.

In accordance with an embodiment of the present invention, selective deposition of tungsten on a silicon surface is performed by flowing silane in the deposition chamber followed by a pump down step prior to the tungsten deposition. The flowing of silane before the tungsten deposition, also referred to as "silane pre-flow," advantageously passivates defects at the silicon surface for a relatively smoother interface between tungsten and silicon and a minimum amount of wormholes. The silane pre-flow helps minimize silicon consumption. The pump down step after the silane pre-flow but before the tungsten deposition advantageously helps remove Si—H$_x$ radicals at the dielectric (e.g., silicon nitride, silicon dioxide) surface responsible for selectivity loss. Table 2. shows an example selective tungsten CVD process incorporating a silane pre-flow step with pump down in accordance with an embodiment of the present invention. The example process of Table 2 may be employed in the fabrication of a MOS transistor. For example, the process of Table 2 may be performed after a source/drain implant in a silicon substrate and a rapid thermal annealing step.

TABLE 2

| SPM clean | $H_2SO_4 + H_2O_2$, 80° C., 300 sec |
|---|---|
| H$_2$ plasma | H$_2$ 500 sccm, P = 13 Pa, 200 W, 90 sec |
| HF clean | boe, 30 sec |
| Selective W deposition | Silane Pre-flow:<br>T = 250° C.,<br>Preflow SiH$_4$,<br>P = 0.3 Pa<br>Pump down<br>T = 250° C.,<br>P = 0.3 Pa,<br>WF$_6$ = 10 sccm,<br>SiH$_4$ = 5 sccm<br>in situ Post Anneal: 520° C.<br>60 sec |

In the example process of Table 2, the silane is pre-flowed into the deposition chamber at a rate of about 5 sccm for about 5 seconds at 270° C., 15 seconds at 260° C., or 30 seconds at 250° C. The silane pre-flow is followed by a pump down step to desorb Si—H$_x$ radicals. The chamber may be pumped down for about 1 second or longer with the silane flow turned OFF. Silane and tungsten hexafluoride are then flowed into the deposition chamber to selectively deposit tungsten on a silicon surface.

As can be appreciated, the incorporation of silane pre-flow and pump down steps in a selective tungsten deposition process helps minimize silicon consumption while providing relatively good selectivity to silicon. The selective tungsten deposition process techniques disclosed herein may be employed in a variety of applications involving selective deposition of tungsten on a silicon surface.

FIG. 1 shows a scanning electron micrograph (SEM) of an example integrated circuit structure. The example structure of FIG. 1 was fabricated using a selective tungsten CVD process similar to that of Table 2 but without a pump down step. In FIG. 1, the bounded amoeba-shaped areas, such as those pointed to by numerals 101 and 102, are of a dielectric (polysilicon/w gate capped with silicon nitride spacer) material. The black region surrounding the dielectric, such as that pointed to by numeral 103, is the selectively deposited tungsten on a bare silicon surface. The arrows point to tungsten nuclei on the dielectric, indicating loss of tungsten selectivity to silicon.

Figure 2:
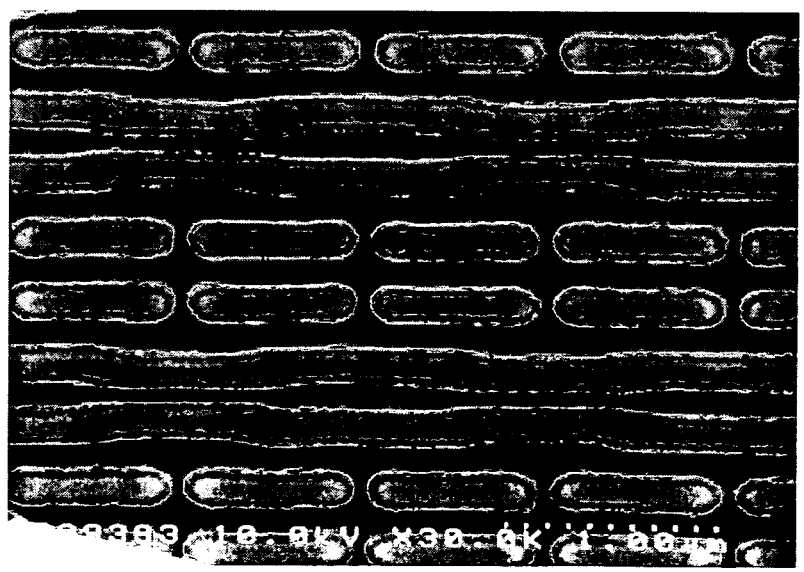
FIG. 2 shows a scanning electron micrograph of an integrated circuit structure fabricated in accordance with an embodiment of the present invention.

FIG. 2 shows a scanning electron micrograph of an example integrated circuit structure fabricated in accordance with an embodiment of the present invention. The structure of FIG. 2 was fabricated using a selective tungsten CVD process similar to that of Table 2. The structures of FIG. 1 and FIG. 2 are similar except that the structure of FIG. 1 was fabricated without a pump down step after the silane pre-flow. The absence of tungsten nuclei on the dielectric in FIG. 2 indicates that the tungsten has relatively good selectively to the silicon surface.

Figure 3:
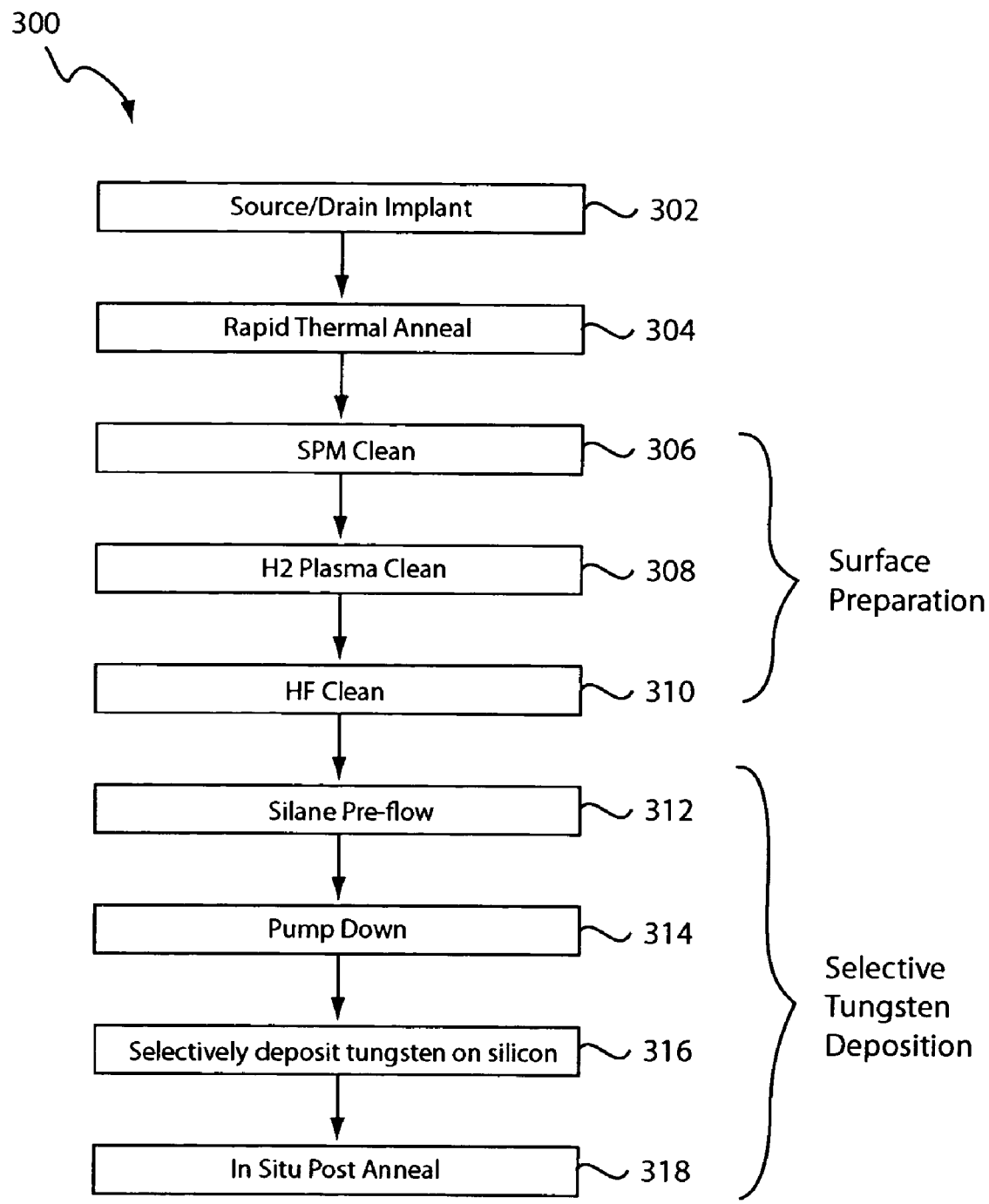
FIG. 3 shows a flow diagram of a method of fabricating an integrated circuit in accordance with an embodiment of the present invention.

FIG. 3 shows a flow diagram of a method 300 of fabricating an integrated circuit in accordance with an embodiment of the present invention. In step 302, dopants are implanted in a silicon substrate to form source and drain regions of a MOS transistor. In step 304, the silicon substrate is subjected to rapid thermal annealing (RTA) to activate the source/drain implants. Steps 302 and 304 are included in method 300 to provide an example as to where in a process sequence a selective tungsten deposition process in accordance with an embodiment of the present invention may be employed. It should be understood, however, that embodiments of the present invention may be employed in other processes requiring selective deposition of tungsten on a silicon surface.

In method 300, steps 306, 308, and 310 comprise surface preparation steps, while steps 312, 314, 316, and 318 comprise selective tungsten deposition steps. The aforementioned surface preparation and selective tungsten deposition steps may be performed using process parameters (e.g., temperature, flow rate, pressure, and duration) shown in Table 2. Other process parameters may also be employed without detracting from the merits of the present invention.

In step 306, an SPM clean may be performed after the rapid thermal annealing step. As is well known, an SPM clean is a mask/resist cleaning step using a mixture of sulfuric acid and hydrogen peroxide. In step 308, an H$_2$ plasma clean step is performed. An H$_2$ plasma clean step involves a slight Si etch of the contaminated surface of the silicon substrate. In step 310, the silicon substrate is subjected to a hydrofluoric acid wet clean. Steps 306, 308, and 310 prepare the surface of the silicon substrate for the subsequent selective tungsten deposition.

In the selective tungsten deposition steps, tungsten is selectively deposited to a bare silicon surface. In this example, tungsten is deposited on exposed portions of the silicon substrate but not appreciably on other materials, such as silicon dioxide or silicon nitride. Selective tungsten deposition may be performed in a chemical vapor deposition (CVD) chamber. In step 312, silane is pre-flowed into the CVD chamber containing the silicon substrate. In one embodiment, only silane is flown into the CVD chamber during the silane pre-flow. The silane may be pre-flowed into the CVD chamber at a rate of about 5 sccm for about 5 seconds at about 270° C., 15 seconds at 260° C., or 30 seconds at 250° C., for example. The silane pre-flow advantageously helps minimize silicon consumption during selective tungsten deposition.

In step 314, the CVD chamber is pumped down after the silane pre-flow. Without being limited by theory, the inventor believes that the pump down helps remove Si—$H_x$ radicals on non-silicon surfaces (e.g., that of dielectrics such as silicon nitride, silicon dioxide) that may have resulted from the silane pre-flow. The CVD chamber may be pumped down for about 1 second or longer with no gas or material flow into the chamber. In method 300 where the pump down is performed right after the silane pre-flow, the pump down is performed by simply turning OFF silane flow into the chamber. The pump down is performed after the silane pre-flow but before the actual selective tungsten deposition (see step 316).

In step 316, tungsten is selectively deposited on exposed portions of the silicon substrate by flowing silane and a tungsten precursor (e.g., tungsten hexafluoride) into the CVD chamber.

In step 318, an in situ post anneal step is performed in the CVD chamber. The post anneal step may be performed by turning off all material flow (silane and tungsten hexafluoride in this example) into the CVD chamber, and heating the substrate in the CVD chamber.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of selectively depositing tungsten on a silicon surface, the method comprising:
    providing a substrate with a silicon surface in a deposition chamber;
    pre-flowing silane into the deposition chamber;
    pumping down the chamber while stopping all gas flow into the deposition chamber for at least one second after pre-flowing the silane but before selectively depositing tungsten on the silicon surface; and
    flowing silane and a tungsten precursor into the deposition chamber to selectively deposit tungsten on the silicon surface.

2. The method of claim 1 wherein the tungsten precursor comprises tungsten hexafluoride.

3. The method of claim 1 wherein the silicon surface is of the substrate.

4. The method of claim 1 wherein the deposition chamber comprises a chemical vapor deposition chamber.

5. The method of claim 1 further comprising annealing the substrate in the deposition chamber after selectively depositing tungsten on the silicon surface.

6. The method of claim 1 further comprising performing a source implant and a drain implant on the substrate prior to pre-flowing the silane.

7. The method of claim 6 further comprising subjecting the substrate to a rapid thermal anneal after the source and drain implants.

8. The method of claim 1 further comprising performing surface preparation steps on the silicon surface prior to pre-flowing the silane.

9. The method of claim 8 wherein the surface preparation steps comprise:
    a mask cleaning step;
    a hydrogen plasma clean step; and
    a wet clean step.

10. A method of fabricating an integrated circuit, the method comprising:
    implanting dopants in a silicon substrate;
    placing the substrate in a deposition chamber;
    pre-flowing silane into the deposition chamber;
    pumping down the deposition chamber while stopping all gas flow into the deposition chamber for at least one second after the pre-flowing of the silane into the deposition chamber but before selectively depositing tungsten on a surface of the substrate; and
    selectively depositing tungsten on the surface of the substrate after the pumping down of the deposition chamber but before the substrate is removed from the chamber.

11. The method of claim 10 wherein the deposition chamber comprises a chemical vapor deposition chamber.

12. The method of claim 10 wherein selectively depositing tungsten on the surface of the silicon substrate comprises:
    flowing silane and tungsten hexafluoride into the deposition chamber.

13. The method of claim 10 further comprising annealing the silicon substrate in the deposition chamber.

14. The method of claim 10 further comprising:
    annealing the silicon substrate after implanting the dopants in the silicon substrate; and
    cleaning the surface of the silicon substrate before placing the substrate in the deposition chamber.

15. The method of claim 14 wherein cleaning the surface of the silicon substrate comprises:
    performing a mask cleaning step;
    performing a hydrogen plasma cleaning step; and
    performing a wet cleaning step.

16. A method of selectively depositing tungsten on silicon, the method comprising:
    pre-flowing silane into a deposition chamber containing a silicon substrate;
    pumping down the deposition chamber while stopping all gas into the deposition chamber for at least one second after the pre-flowing of the silane into the deposition chamber; and
    selectively depositing tungsten on a surface of the silicon substrate after the pumping down of the deposition chamber but before the silicon substrate is removed from the deposition chamber.

17. The method of claim 16 further comprising:
    annealing the silicon substrate in the deposition chamber after selectively depositing tungsten on the surface of the silicon substrate.

18. The method of claim 16 wherein the surface of the silicon substrate is cleaned prior to placing the silicon substrate in the deposition chamber.

19. The method of claim 16 wherein selectively depositing tungsten on the surface of the silicon substrate comprises:
    flowing silane and a tungsten precursor into the deposition chamber.

20. The method of claim 19 wherein the tungsten precursor comprises tungsten hexafluoride.

* * * * *